(12) United States Patent
Xia et al.

(10) Patent No.: US 10,250,280 B2
(45) Date of Patent: Apr. 2, 2019

(54) METHOD AND APPARATUS OF A FULLY-PIPELINED LAYERED LDPC DECODER

(71) Applicant: Tensorcom, Inc., Carlsbad, CA (US)

(72) Inventors: Bo Xia, Carlsbad, CA (US); Ricky Lap Kei Cheung, San Diego, CA (US); Bo Lu, Carlsbad, CA (US)

(73) Assignee: TensorCom, Inc., Culver City, CA (US)

( * ) Notice: Subject to any disclaimer, the term of this patent is extended or adjusted under 35 U.S.C. 154(b) by 181 days.

(21) Appl. No.: 15/011,252

(22) Filed: Jan. 29, 2016

(65) Prior Publication Data
US 2016/0173131 A1    Jun. 16, 2016

Related U.S. Application Data

(63) Continuation of application No. 14/165,505, filed on Jan. 27, 2014, now Pat. No. 9,276,610.

(51) Int. Cl.
*H03M 13/11* (2006.01)
(52) U.S. Cl.
CPC ...... *H03M 13/1145* (2013.01); *H03M 13/114* (2013.01); *H03M 13/116* (2013.01); *H03M 13/1122* (2013.01); *H03M 13/1148* (2013.01)
(58) Field of Classification Search
CPC .................................................. H03M 13/11
USPC .......................... 714/773, 729, 731, 734, 736
See application file for complete search history.

(56) References Cited

U.S. PATENT DOCUMENTS

| 6,938,196 | B2 | 8/2005 | Richardson et al. |
| 7,133,853 | B2 | 11/2006 | Richardson et al. |
| 7,281,192 | B2 | 10/2007 | Shen et al. |
| 7,397,871 | B2 | 7/2008 | Wiss et al. |
| 7,631,241 | B2 | 12/2009 | Park et al. |
| 7,673,223 | B2 | 3/2010 | Richardson et al. |

(Continued)

OTHER PUBLICATIONS

"LDPC decoder architecture for high-data rate personal-area networks", Weiner, M. ; Nikolic, B. ; Zhengya Zhang Circuits and Systems (ISCAS), 2011 IEEE International Symposium on Digital Object Identifier: 10.1109 ISCAS.2011.5937930 Publication Year: 2011 , pp. 1784-1787.

(Continued)

*Primary Examiner* — Fritz Alphonse
(74) *Attorney, Agent, or Firm* — Mintz Levin Cohn Ferris Glovsky and Popeo, P.C.

(57) ABSTRACT

Processors are arranged in a pipeline structure to operate on multiple layers of data, each layer comprising multiple groups of data. An input to a memory is coupled to an output of the last processor in the pipeline, and the memory's output is coupled to an input of the first processor in the pipeline. Multiplexing and de-multiplexing operations are performed in the pipeline. For each group in each layer, a stored result read from the memory is applied to the first processor in the pipeline structure. A calculated result of the stored result is output at the last processor and stored in the memory. Once processing for the last group of data in a first layer is completed, the corresponding processor is configured to process data in a next layer before the pipeline finishes processing the first layer. The stored result obtained from the next layer comprises a calculated result produced from a layer previous to the first layer.

19 Claims, 14 Drawing Sheets

Parity-check realization

(56) References Cited

U.S. PATENT DOCUMENTS

| | | |
|---|---|---|
| 9,325,347 B1 * | 4/2016 | Graumann ......... H03M 13/1128 |
| 9,436,169 B2 * | 9/2016 | Gan ....................... G06Q 50/06 |
| 2003/0225829 A1 * | 12/2003 | Pena ................. G06F 17/30899 |
| | | 709/203 |
| 2005/0143125 A1 | 6/2005 | Maltsev et al. |
| 2006/0128348 A1 | 6/2006 | Jang |
| 2012/0314750 A1 | 12/2012 | Mehrabani |
| 2014/0016677 A1 | 1/2014 | Dua et al. |

OTHER PUBLICATIONS

"A Reduced-Complexity Architecture for LDPC Layered Decoding Schemes", Sangmin Kim ; Sobelman, G.E. ; Hanho Lee, Very Large Scale Integration (VLSI) Systems, IEEE Transactions on vol. 19 , Issue: 6 Digital Object Identifier: 10.1109/TVLSI.2010.2043965 Publication Year: 2011 , pp. 1099-1103.

"Panasonic Develops Industry's Lowest Power Consumption* Chipset of Less Than 1-Watt for Multi-gigabit Millimeter Wave Wireless Communication", Press Release, Panasonic Corporation, Mar. 19, 2012, p. 1-4.

* cited by examiner

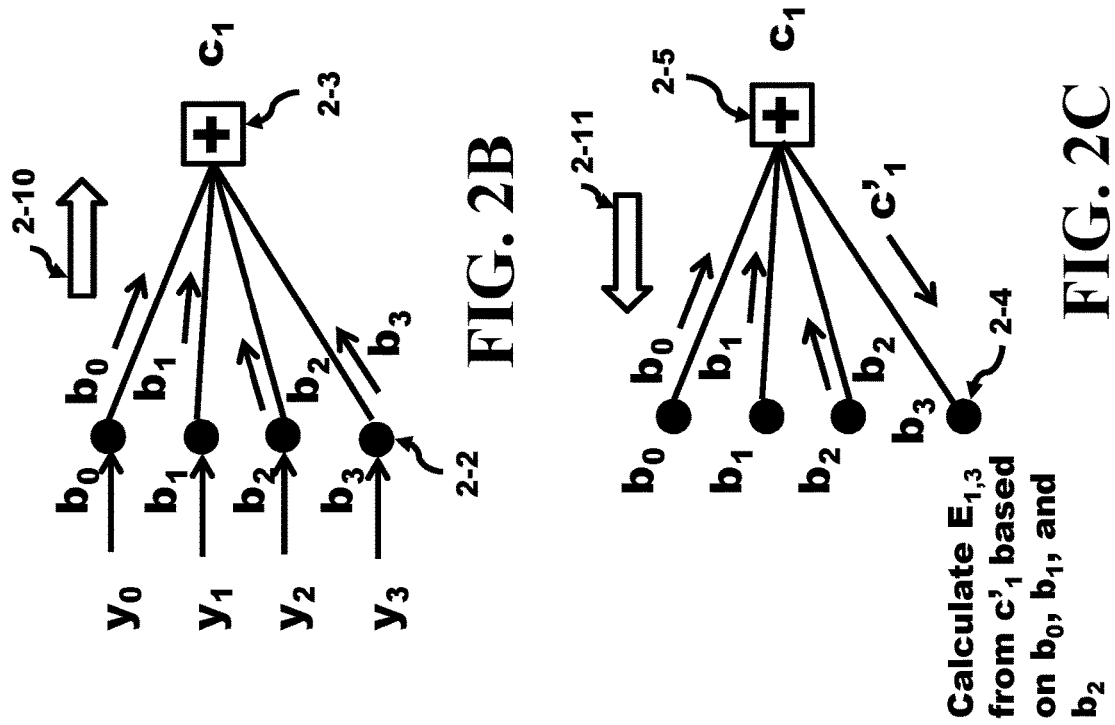
FIG. 2B
FIG. 2C
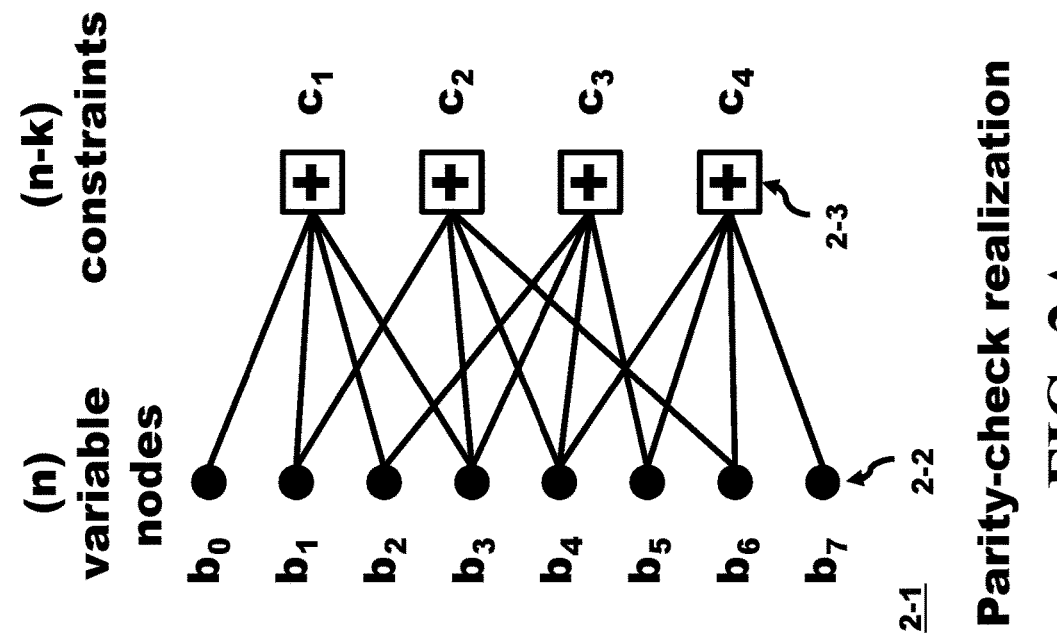
FIG. 2A

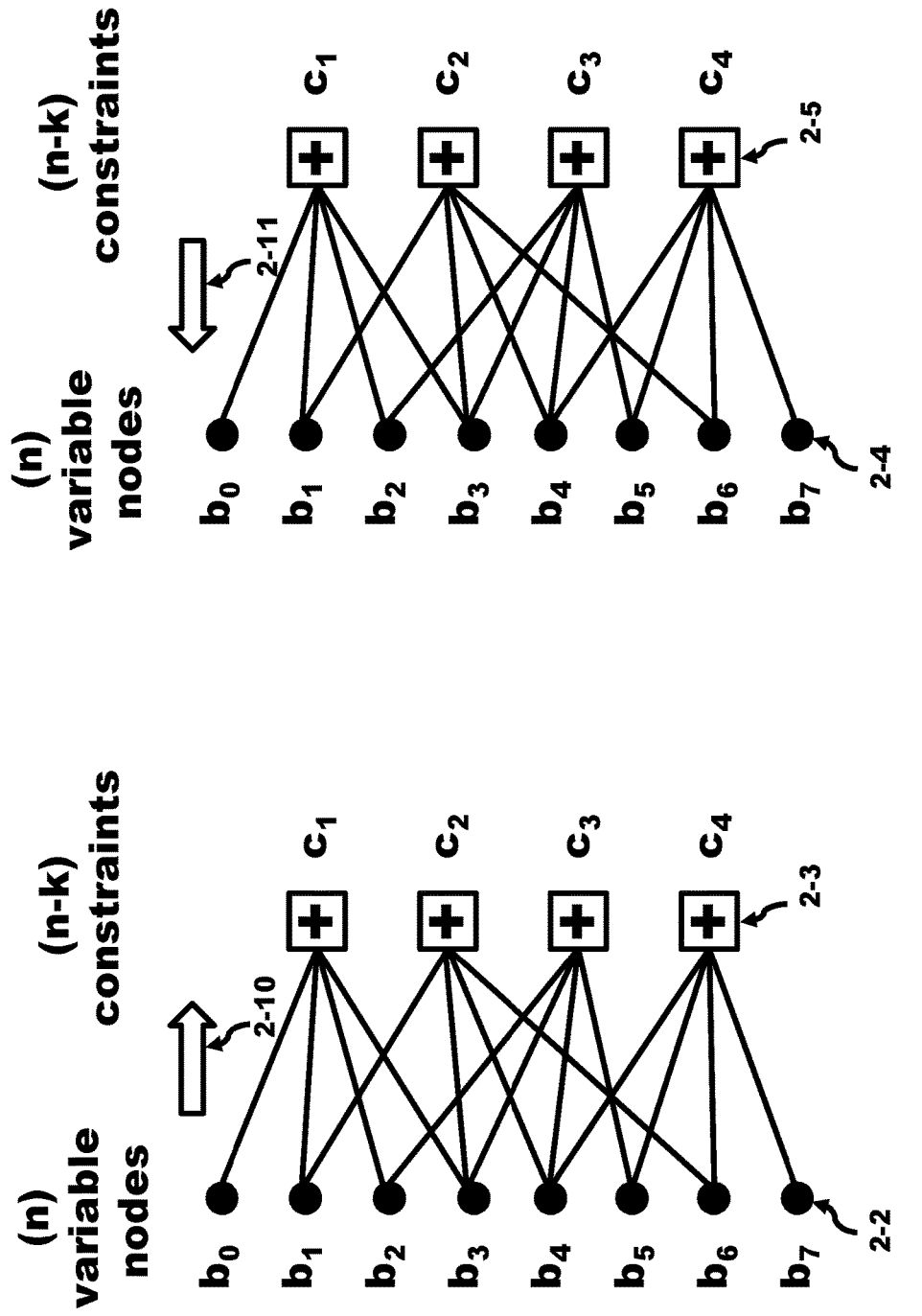
FIG. 3B  Generator realization
FIG. 3A  Parity-check realization

Rate-1/2 LDPC code matrix H; 336 rows × 672 columns, Z=42

| | | | | | | | | | | | | | | | |
|---|---|---|---|---|---|---|---|---|---|---|---|---|---|---|---|
| 40 | | | | | | | | | 38 | | 13 | 5 | | 18 | |
| 34 | | 35 | | 27 | | | | 30 | 2 | 1 | | | | | |
| | 36 | | 31 | | 7 | | | | | | | | | | |
| | 27 | | 18 | | 12 | 20 | | 10 | 41 | | 15 | 6 | | | |
| 35 | 41 | | 40 | | | 39 | 28 | | | | | 3 | 28 | | |
| 29 | 0 | | | | 22 | | | | | | 12 | | 27 | 23 | 0 | 13 |
| | | 31 | | 23 | 21 | | 20 | 28 | | | | | | 22 | |
| | 22 | | 34 | 31 | 14 | | 4 | | | | | 13 | | | |

→ Layer 0
→ Layer 1
→ Layer 2
→ Layer 3
→ Layer 4
→ Layer 5
→ Layer 6
→ Layer 7

Each nonblank element I in the table is the cyclic permutation matrix Pi
of size Z x Z; blank entries represents the zero matrix of size Z x Z
(From 802.11ad)

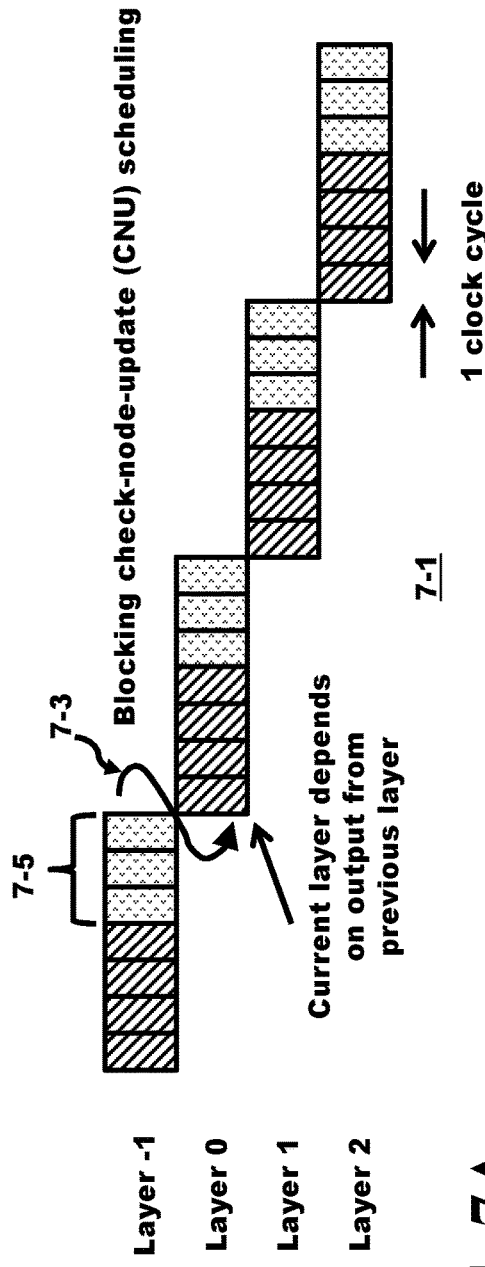
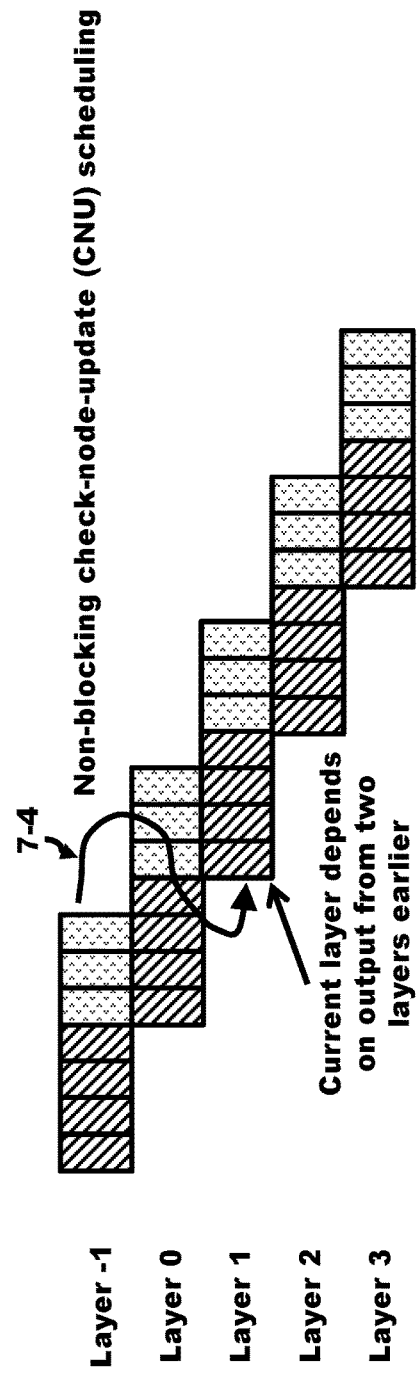
FIG. 7A
FIG. 7B

| Blocking Mode (3 wait states per layer) - Layered Decoding | | | | |
|---|---|---|---|---|
| Offset Min-Sum with beta = 1; Clock domain 440MHz | | | | |
| Number of core processor = 4   Each layer 42 check nodes X 42 bit nodes | | | | |
| rate | 1/2 | 5/8 | 3/4 | 13/16 |
| No. Clock cycles | 27 | 26 | 28 | 21 |
| Max # of iterations BPSK | 7 | 7 | 6 | 9 |
| Max # of iterations QPSK | 3 | 3 | 3 | 4 |

| Non-Blocking mode - Layered Decoding | | | | |
|---|---|---|---|---|
| Offset Min-Sum with beta = 1; Clock domain 440MHz | | | | |
| Number of core processor = 4  Each layer 42 check nodes X 42 bit nodes | | | | |
| rate | 1/2 | 5/8 | 3/4 | 13/16 |
| No. Clock cycles | 16 | 16 | 16 | 12 |
| Max # of iterations BPSK | 11 | 11 | 11 | 15 |
| Max # of iterations QPSK | 5 | 5 | 5 | 7 |

METHOD AND APPARATUS OF A FULLY-PIPELINED LAYERED LDPC DECODER

CROSS-REFERENCE TO OTHER APPLICATIONS

This application is a continuation of application Ser. No. 14/165,505, filed Jan. 27, 2014, entitled, "Method and Apparatus of a Fully-Pipelined Layered LDPC Decoder," which is incorporated herein by reference in its entirety.

BACKGROUND OF THE INVENTION

Federal Communications Commission (FCC) has allotted a spectrum of bandwidth in the 60 GHz frequency range (57 to 64 GHz). The Wireless Gigabit Alliance (WiGig) is targeting the standardization of this frequency band that will support data transmission rates up to 7 Gbps. Integrated circuits, formed in semiconductor die, offer high frequency operation in this millimeter wavelength range of frequencies. Some of these integrated circuits utilize Complementary Metal Oxide Semiconductor (CMOS), Silicon-Germanium (SiGe) or GaAs (Gallium Arsenide) technology to form the dice in these designs. The receive path of the signal being transferred in the wireless channel in these communication system need to be compensated for various very dispersive conditions occurring in the wireless channel. Some of these conditions include multipath reflection, multipath resilience, ISI (Inter Symbol Interference), channel capacity, strategies for frequency diversity scheduling, etc.

CMOS (Complementary Metal Oxide Semiconductor) is the primary technology used to construct integrated circuits. N-channel devices and P-channel devices (MOS device) are used in this technology which uses fine line technology to consistently reduce the channel length of the MOS devices. Current channel lengths are 40 nm, the power supply of VDD equals 1.2V and the number of layers of metal levels can be 8 or more.

CMOS offers the computing power to perform many of the required compensation techniques requires overcoming the adverse conditions of the wireless channel. Yet, the computing power must be used in a power efficient manner to insure that the dissipated power is low enough to allow these important building blocks of the transceiver fabricated in CMOS to be used in mobile applications. This helps to insure that the energy drawn from the limited power contained in the battery is minimized while achieving the optimum performance.

Orthogonal frequency division multiplexing (OFMA) is a multi-carrier system that has been used in various communication Standards such as 802.11 (Wi-Fi), digital video broadcasting (DVB), asymmetrical digital subscriber lines (ASDL), etc. However, OFDM suffers from several deficiencies including peak to average power ratio (PAPR), sensitivity to amplifier nonlinearities, and effects of frequency offsets. Single carrier (SC) communication systems, however, overcome these several deficiencies and offer several benefits over OFDM systems.

SC communication systems is a single-carrier transmit signal that partitions their wideband channel into a large number of parallel narrowband subcarriers and has a lower PAPR resulting in design parameters in the transmit path that are simpler to achieve when compared to OFDM.

In the transmitter side as illustrated in FIG. 1, the input signals are mapped 1-2 into symbols, then the symbols are converted from a serial path into parallel blocks with a series to parallel (S/P) converter 1-3 so a cyclic prefix 1-4 can be added to each block. A parallel to serial (P/S) converter 1-5 recombines these blocks into a serial link which is zero padded and filtered 1-6. A digital to analog (D/A) converter 1-7 converts the digital serial link to an analog signal and presented to an analog transmitter 1-8. The signal is sent over the wireless channel 1-9 which time disperses the signal and introduces noise 1-21 into the signal. A receiver front end 1-10 receives the distorted wireless signal and converted to a digital signal with an analog to digital (A/D) converter 1-11. The signal is then filtered 1-12. The prefix is removed 1-13 and a S/P converter 1-14 generates a time domain of parallel block signals that are converter by an fast Fourier transform (FFT) 1-15 in to the frequency domain. A frequency domain equalizer 1-16 is applied to each of the transmitted subcarriers where the channel distortion caused by the channel is compensated for each subcarrier by the frequency domain equalizer. The FFT and frequency domain equalization requires less computation power than an equivalent performing time-domain equalization. An inverse FFT (IFFT) 1-17 generates the time domain representation of the frequency compensated transmitted signal to a de-mapper unit 1-18. The De-mapper feeds its output to a low density parity check (LDPC) decoder 1-22. The LDPC, invented by Gallager "R. G. Gallager, *Low Density Parity Check Codes*, Cambridge, Mass., MIT Press, 1963., is a well-known linear error code correcting code that approaches the Shannon limit and therefor called a capacity approaching code. After the LDPC, the recovered messages are then applied to a descrambler 1-23 to recover the symbols which are then applied to a P/S converter 1-19. The output signal is applied to the baseband circuitry of the receiver to extract the signals from the transmitter. The combination of the de-mapper, LDPC decoder and descrambler is contained within the dotted box 1-24 and will be described in more detail shortly.

A parity-check decoder allows error correction allows messages which are transmitted over a noisy transmission medium to be captured and recovered at a receiver with a noise threshold that can approach the upper bound of the channel noise. These messages comprise codewords [C] that are generated with additional bits for redundancy. These additional bits are called check bits and are placed in the codewords making each codeword distinct from another codeword. This error recovery decoder is required where the codewords as sent by the transmitter are altered in transit to the receiver. The medium which interconnects the transmitter to the receiver can be noisy and can alter the value of the bits contained within the codewords. An example of a hostile medium is a wireless connection between the transmitter and the receiver. Such a wireless medium suffers from noise of the environment, other transmitters in the local area competing for the limited available spectrum, multiple path reflections from buildings and structures, signal loss, and etc.

A Hamming distance separates the codewords from one another and is the number of bit positions that are different. For instance, the codeword [0 1 0 0 1 1 0 1] differs from the codeword [0 1 0 1 0 1 0 0] by three positions: $4^{th}$, $5^{th}$, and $8^{th}$. This large Hamming distance helps to identify the proper codeword during error recovery of a decoder since the decoder would pick the closest one after the algorithm has completed.

A spare matrix H called a parity-check matrix determines the codewords of the source message that satisfies the following equation:

$$HC=0 \quad \text{(EQ. 1)}$$

over the Galois field GF(2).

$$H = \begin{bmatrix} 1 & 1 & 0 & 1 & 0 & 0 \\ 0 & 1 & 1 & 0 & 1 & 0 \\ 1 & 1 & 1 & 0 & 0 & 1 \end{bmatrix} = [A \ I_{n-k}] \quad \text{(EQ. 2)}$$

where n=length of codeword and k=bits in the message. I is the identity matrix and A
The constraints for the parity-check matrix H are:

$$c_0+c_1+c_3=0;$$

$$c_2+c_3+c_5=0;$$

$$c_1+c_2+c_3+c_6=0; \quad \text{(EQ. 3)}$$

A good received codeword at the transmitter satisfies the following equation:

$$Hy^T=0 \quad \text{(EQ. 4)}$$

where $y^T$ is the received codeword at the receiver.

A generator is required to create these codewords at the transmitter. Gauss-Jordan elimination on H can be used to find the generator G by inverting $[A \ I_{n-k}]$ to reach $[I \ A^{-1}]$ or:

$$G = \begin{bmatrix} 1 & 0 & 0 & 1 & 0 & 1 \\ 0 & 1 & 0 & 1 & 1 & 1 \\ 0 & 0 & 1 & 0 & 1 & 1 \end{bmatrix} = [I \ A^{-1}] \quad \text{(EQ. 5)}$$

The source message S is combined with the parity check bits to generate a codeword C for that source message S at the source. The interconnect medium contributes noise to the message such that the received message Y now contains noise N, or Y=C+N. The spare matrix is known at both the source and destination and the destination and is used to calculate the vector Z=HY=HC+HN at the receiver, and from EQ. 1, Z=HN. This last relationship is used by the decoding process to find the equation which solves HN=Z to determine the noise component n. This noise estimate is subtracted from the received signal y to recover the codeword C. Once the codeword, as sent by the transmitter is recovered at the receiver, the original source message S can be extracted and provided to the transmitter.

Several methods of decoding a LDPC code are available some use the hard values while others use the soft values. The binary erasure channel and bit-flipping decoding use the hard values to determine the value of the corrupted bit. The sum-product decoding method uses soft values. Soft values comprise the sign of the bit values and the magnitude of the bit values, while hard values only look at the sign of the bit value. These iteratively decoding algorithms like the sum-product algorithm are called by different names: the belief propagation algorithm, and the message passing algorithm.

A description of several decoders including the LDPC is provided. Data that has been transmitted satisfies an LDPC code uses a parity-check representation of a binary linear (n, k) block code C where C is the set of all binary n-tuples that satisfy the following (n-k) parity check equation, $$bH^T=0 \quad \text{(EQ. 6)}$$

where H is a sparse (n-k) (n) parity check matrix. There are (n) observed bits b, (k) linearly independent generators or constraints in C. The densities of ones in the matrix should be sparse so that the iterative sum-product can be performed quickly to decode the information.

A Tanner graph of a parity check representation for an (8, 4, 4) code is presented in FIG. 2A. This Tanner graph shows a graphical representation of an elementary linear behavior realization of a linear (n, k) block code over $F_q$ of a system and is defined by its trajectories of local constraints. There are (n) variable nodes, (n-k) constraint (zero-sum) nodes which are linearly independent generators in C. The number of edges in the Tanner graph is equal to the number of ones in the parity-check matrix H. These trajectories are the codewords which satisfy those particular constraints. In this graphical representation you could have an observed symbol (n) within the code word. A hidden symbol (u) which represents the state. And you could have the constraints which are the linear homogeneous equations on the subset of the variables.

First the elementary realizations of linear (n, k) block codes over a finite field $F_q$ are illustrated. The code C is the set of all linear combinations $\Sigma_i u_i g_i$ over the finite field where the set of generators $g_j$ where j is less than or equal to k.

For the (8, 4, 4) code, G is the generator matrix and is shown in EQ. 7, where the n is the number of bits in the codeword, m is the number of parity-check equations, and k is the number of information bits. The code for G is:

$$G = \begin{matrix} b_0 b_1 b_2 b_3 b_4 b_5 b_6 b_7 \\ \begin{bmatrix} 1 & 1 & 1 & 1 & 0 & 0 & 0 & 0 \\ 0 & 1 & 0 & 1 & 1 & 0 & 1 & 0 \\ 0 & 0 & 1 & 1 & 1 & 1 & 0 & 0 \\ 0 & 0 & 0 & 0 & 1 & 1 & 1 & 1 \end{bmatrix} \end{matrix} \quad \text{(EQ. 7)}$$

the columns are labeled $b_0 \ldots b_7$ along the top, while the rows would be labeled (not shown) as $c_1, c_2, c_3,$ and $c_4$ from top to bottom. FIG. 2A illustrates the parity-check realization of the generator matrix EQ. 7. The (n) variable nodes are shown on the left range from $b_0$ to $b_7$ and the (n-k) constraints range from $c_i$ to $c_4$. Each of the blocks with the (+) calculates the exclusive or of the inputs such that they should equal to zero if the codeword is unaltered.

The set of bits in the j-th parity check equation of the code is determined using the generator matrix G and setting the constraint equations in columns $b_0 \ldots b_7$ equal to the summation of those positions where the matrix has a one for the state variables; $c_1, c_2, c_3,$ and c as:

$$b_0=c_1;$$

$$b_1=c_1+c_2;$$

$$b_2=c_1+c_3;$$

$$b_3=c_1+c_2+c_3;$$

$$b_4=c_2+c_3+c_4;$$

$$b_5=c_3+c_4;$$

$$b_6=c_2+c_4;$$

$$b_7=c_4; \quad \text{(EQ. 8)}$$

The Tanner graph of the $4^{th}$ bit relation of EQ. 8 is depicted in FIG. 2A.

The parity-check equations are determined from EQ. 7 and provides the 4 constraint linear homogeneous equations that summing each row as a function of the 8 constraint variables $x_0 \ldots x_7$ to zero:

$$x_0+x_1+x_2+x_3=0;$$

$$x_1+x_3+x_4+x_6=0;$$

$$x_2+x_3+x_4+x_5=0;$$

$$x_4+x_5+x_6+x_7=0; \quad \text{(EQ. 9)}$$

At the start of the first cycle, the sum product decoding of LDPC broadcast the bit nodes $b_i$ to the check-nodes $c_j$. For example, the $b_0$ equals the intrinsic value $y_0$ received from the channel, the $b_1$ equals the intrinsic value $y_1$ received from the channel, the $b_2$ equals the intrinsic value $y_2$ received from the channel, and the $b_3$ equals the intrinsic value $y_3$ received from the channel as illustrated in FIG. 2B. Each of the values $b_i$ received at parity-check nodes $c_j$ are used in the parity-check equations to further the calculations. The arrow 2-10 indicates that the movement of data is from the bit-nodes 2-2 to the constraint-nodes 2-3.

For instance in FIG. 2C, the input values: $b_0$, $b_1$, and $b_2$ are sent to parity-check node $c_1$ and are used to calculate the value of $c'_1$. Once calculated, the parity-check $c_1$ 2-5 sends the result to the bit node $b_3$ 2-4. After bit node $b_3$ receives the value of $c'_1$ calculated by the parity-check $c_1$. The bit-node $b_3$ stores the message of $c'_1$ as $E_{1,3}$ at bit-node $b_3$. The arrow 2-11 indicates that the movement of data is from the constraint-node 2-5 to the bit-node 2-4.

In FIG. 2D, the input values: $b_1$, $b_4$, and $b_6$ are sent to parity-check node $c_2$ and are used to calculate the value of $c'_2$. Once calculated, the parity-check $c_2$ 2-6 sends the result to the bit node $b_3$ 2-4. After bit node $b_3$ receives the value of $c'_2$ calculated by the parity-check $c_2$. The bit-node $b_3$ stores the message of $c'_2$ as $E_{2,3}$ at bit-node $b_3$. The arrow 2-11 indicates that the movement of data is from the constraint-node 2-6 to the bit-node 2-4.

In FIG. 2E, the input values: $b_2$, $b_4$, and $b_5$ are sent to parity-check node $c_3$ and are used to calculate the value of $c'_3$. Once calculated, the parity-check $c_3$ 2-7 sends the result to the bit node $b_3$ 2-4. After bit node $b_3$ receives the value of $c'_3$ calculated by the parity-check $c_3$. The bit-node $b_3$ stores the message of $c'_3$ as $E_{3,3}$ at bit-node $b_3$. The arrow 2-11 indicates that the movement of data is from the constraint-node 2-7 to the bit-node 2-4.

A majority-rule is presented in FIG. 2F. Node $b_3$ performs a modulo 2 addition on the values of $E_{1,3}$, $E_{2,3}$ and $E_{3,3}$. In a first case, the result generates a "1" then the extrinsic value of $y_3$ must be a "1" to maintain that overall parity-check of all inputs: $E_{1,3}$, $E_{2,3}$ and $E_{3,3}$, and $y_3$ must generate a "0" to insure that the parity-check condition is maintained. In a second case, if the modulo 2 addition on the values of $E_{1,3}$, $E_{2,3}$ and $E_{3,3}$ results in a "0", then the extrinsic value of $y_3$ must be a "0" to maintain that overall parity-check of all inputs: $E_{1,3}$, $E_{2,3}$ and $E_{3,3}$, and $y_3$ must generate a "0" to insure that the parity-check condition is maintained. In both cases, if the parity-check condition is maintained, then the extrinsic value is correct. If the parity-check condition is maintained for all bit-node $b_0$-$b_n$, then EQ. 1 is satisfied and the iterative cycle can stop. Otherwise, in the next cycle all the values of the previous cycle regarding the calculation of the modulo 2 addition of all values of $E_{j,i}$, at a particular bit-node $b_i$ is substituted for $y_i$ and the next cycle begins.

The extrinsic message $c'_j$ from the parity-check node j to bit-node i is the probability that bit i causes the parity-check at parity-node constraint j to be satisfied when bit i=1. This probability is given as:

$$P_{j,i}^1 = \frac{1}{2} - \frac{1}{2} \prod_{c'_i \neq c_j} (1 - 2P_{c'}^1) \quad \text{(EQ. 10)}$$

where $P_{c'}^1$ is the current estimate for the bit=1 during the current cycle. The product is taken over the message edges between the bit-node and all connected check-nodes $c_i$. The probability that the parity-check equation is satisfied when bit i=0. This probability is given as:

$$P_{j,i}^0 = 1 - P_{j,i}^1 = \frac{1}{2} + \frac{1}{2} \prod_{c'_i \neq c_j} (1 - 2P_{c'}^1) \quad \text{(EQ. 11)}$$

The log likelihood ratios (LLR) $E_{j,i}$ is the LLR of EQ. 11 or:

$$E_{j,i} = LLR(P_{j,i}^1) = \log\left(\frac{1 - P_{j,i}^1}{P_{j,i}^1}\right) \quad \text{(EQ. 12)}$$

where the log is $\log_e$ and using EQ. 10 gives:

$$E_{j,i} = \log\left(\frac{\frac{1}{2} + \frac{1}{2}\prod_{c'_i \neq c_j}(1 - 2P_{c'}^1)}{\frac{1}{2} - \frac{1}{2}\prod_{c'_i \neq c_j}(1 - 2P_{c'}^1)}\right) \quad \text{(EQ. 13)}$$

With the aid of EQ. 12, $$\frac{1 - P_{j,i}^1}{P_{j,i}^1} = e^{M_{j,i'}} \quad \text{(EQ. 14)}$$

solving for $P_{j,i}^1$ gives:

$$P_{j,i'}^1 = \frac{1}{1 + e^{M_{j,i'}}} = \left(\frac{Pr[c'=0 \mid y]}{Pr[c'=1 \mid y]}\right) \quad \text{(EQ. 15)}$$

where Pr[c'=0|y] is the probability of event [c'=0] given the event y and Pr[c'=1|y] is the probability of event [c'=1] given the event y. Determining $(1-2P_{c'}^1)$ gives:

$$(1 - 2P_{c'}^1) = 1 - \frac{2}{1 + e^{M_{j,i'}}} = \frac{e^{M_{j,i'}} - 1}{e^{M_{j,i'}} + 1} = \tanh\left(\frac{M_{j,i'}}{2}\right) \quad \text{(EQ. 16)}$$

Substituting EQ. 16 into EQ. 13 gives:

$$E_{j,i} = \log\left(\frac{\frac{1}{2} + \frac{1}{2}\prod_{c'_i \neq c_j}\tanh\left(\frac{M_{j,i'}}{2}\right)}{\frac{1}{2} - \frac{1}{2}\prod_{c'_i \neq c_j}\tanh\left(\frac{M_{j,i'}}{2}\right)}\right) \quad \text{(EQ. 17)}$$

The following is a fundamental logarithmic identity:

$$2\tanh^{-1}\left(\frac{M_{j,i'}}{2}\right) = \log\left(\frac{1+\left(\frac{M_{j,i'}}{2}\right)}{1-\left(\frac{M_{j,i'}}{2}\right)}\right) \quad \text{(EQ. 18)}$$

EQ. 18 can be used in EQ. 17 to provide:

$$E_{j,i} = 2\tanh^{-1}\left(\Pi_{c_i'\neq c_j}\tanh\left(\frac{M_{j,i'}}{2}\right)\right) \quad \text{(EQ. 19)}$$

$E_{j,i}$ is the extrinsic LLR message from each check-node $c_j$ to a particular bit-node $b_i$ which also receives an a priori LLR from the $i^{th}$ bit position of the input codeword $y_i$. The total LLR of the probability include all the check-nodes satisfying one of the parity-check equations and the $i^{th}$ bit position of the input codeword $y_i$:

$$L_i = \text{LLR}(P_i^1) = r_i + \Sigma_{j \in A_i} E_{j,i} \quad \text{(EQ. 20)}$$

where $r_i$ is the LLR of the a priori of the $i^{th}$ bit position of the input codeword $y_i$:

$$r_i = \left(\frac{Pr[c_i = 0 \mid y]}{Pr[c_i = 1 \mid y]}\right) \quad \text{(EQ. 21)}$$

The message $M_{i,j}$ sent from a bit-node $b_i$ to check-nodes $c'$ indicates the LLR excluding the check-node $c_j$ and is given as:

$$M_{i,j} = -r_i + \Sigma_{j' \neq j} E_{j',i} \quad \text{(EQ. 22)}$$

For a additive white Gaussian noise (AWGN) channel, the a priori LLR is given by $$r_i = 4y_i \frac{E_s}{N_o} = \frac{2y_i}{\sigma^2} \quad \text{(EQ. 23)}$$

Log likelihood ratios (LLR) are used in the sum-product algorithm. Let R have the elements (0,1) in the GF (2) field. The LLR of a binary random variable R, $L(r)$, is then defined as:

$$L(r_i) = \log\left(\frac{Pr[r_i = 0 \mid y]}{Pr[r_i = 1 \mid y]}\right) \quad \text{(EQ. 24)}$$

$L(r_i)$ then indicates the probability that the random variable R takes on the value $r_i$. The magnitude of the log-likelihood ratio $L(r_i)$ determines the so called "soft" value ($\alpha_{j,i'}$) of the random variable R while the hard decision is determined by the sign ($\beta_{j,i'} = |M_{j,i'}|$) of the magnitude $|L(r_i)|$ and is the reliability of this decision.
Substituting $$\tanh\left(\frac{M_{j,i'}}{2}\right) = (\alpha_{j,i'})\tanh\left(\frac{(\beta_{j,i'})}{2}\right)$$

$$\Pi_{c_i'\neq c_j}\tanh\left(\frac{M_{j,i'}}{2}\right) = [\Pi_{c_i'\neq c_j}\alpha_{j,i'}]\left[\Pi_{c_i'\neq c_j}\tanh\left(\frac{\beta_{j,i'}}{2}\right)\right] \quad \text{(EQ. 25)}$$

Placing EQ. 25 into EQ. 19 gives:

$$E_{j,i} = [\Pi_{c_i'\neq c_j}\alpha_{j,i'}]2\tanh^{-1}\log^{-1}\log\left[\Pi_{c_i'\neq c_j}\tanh\left(\frac{\beta_{j,i'}}{2}\right)\right] \quad \text{(EQ. 26)}$$

distributing the $\log^{-1}$ log term provides:

$$E_{j,i} = [\Pi_{c_i'\neq c_j}\alpha_{j,i'}]2\tanh^{-1}\log^{-1}\left[\Pi_{c_i'\neq c_j}\log\tanh\left(\frac{\beta_{j,i'}}{2}\right)\right] \quad \text{(EQ. 27)}$$

The sum-product algorithm of the LDPC can be further simplified by partitioning the LLR ratio into a magnitude component and a sign component. Furthermore, a product term can be replaced with an additive term by utilizing logarithms.

$$\psi(\beta_{j,i'}) = \log\left(\tanh\left|\frac{\beta_{j,i'}}{2}\right|\right) \quad \text{(EQ. 28)}$$

and solving for $\beta_{j,i'}$ in EQ. 28 provides:

$$\beta_{j,i'} = 2\tan h^{-1}\log^{-1}[\psi(\beta_{j,i'})] \quad \text{(EQ. 29)}$$

substituting EQ. 28 and EQ. 29 into EQ. 27 leaves:

$$E_{j,i} = [\Pi_{c_i'\neq c_j}\alpha_{j,i'}]2\tan h^{-1}\log^{-1}[\Sigma_{c_i'\neq c_j}\psi(\beta_{j,i'})] \quad \text{(EQ. 28)}$$

and $$\tanh\left|\frac{\beta_{j,i'}}{2}\right| = \log^{-1}\psi(\beta_{j,i'})$$

where solving for $\beta_{j,i'}$ gives:

$$E_{j,i} = -[\Pi_{c_i'\neq c_j}\alpha_{j,i'}]\psi[\Sigma_{c_i'\neq c_j}\psi(\beta_{j,i'})] \quad \text{(EQ. 29)}$$

The final equations that are used are arrived at by setting $R_{j,i} = E_{j,i}$; $\beta_{j,i'} = L(q_{j,i'})$; $\alpha_{j,i'} = \text{sign } L(q_{j,i'})$; in EQ. 29:

$$S_{j,i} = [\Pi_{c_i'\neq c_j}\alpha_{j,i'}] = \Pi_{c_i'\neq c_j}[\text{sign}L(q_{j,i'})] \quad \text{(EQ. 30)}$$

and $$A_{j,i}[\Sigma_{c_i'\neq c_j}\psi(\beta_{j,i'})] = \Sigma_{c_i'\neq c_j}\psi(L(q_{j,i})) \quad \text{(EQ. 31)}$$

$$R_{j,i} = -S_{j,i}\psi[A_{j,i}] \quad \text{(EQ. 32)}$$

setting $\Sigma_{j \in A_i} E_{j,i} = L(q_{j,i})$; $r_i = R_{j,i}$; $L_i = L(q_j) = M_{i,j}$; EQ. 20 becomes:

$$L(q_{j,i}) = L(q_j) - R_{j,i} \quad \text{(EQ. 33)}$$

Using EQ. 22, and EQ. 23, the message $M_{i,j}$ sent from a bit-node $b_i$ to check-nodes $c'$ indicates the LLR excluding the check-node $c_j$ and is given as:

$$L(q_j) = \frac{2y_i}{\sigma^2} + \Sigma_{j \neq j'} R_{j,i} \quad \text{(EQ. 34)}$$

The received bits represent probabilities at each bit node or input node. These bit-nodes are combined with the constraints-nodes in a Tanner graph to perform the belief propagation procedure. In the first iteration, these probabilities are passed from the bit-nodes to the constraint-nodes and are updated according to the parity check constraints. These values become updated and the new probabilities are send back to the symbol nodes which also performs the parity check constraint. At the bit-nodes, the values are again updated and if EQ. 4 is satisfied, then the process stops; otherwise, the recalculated probabilities at each bit-node or input nodes are passed from these bit-nodes to the constraint-nodes again in additional iterative manner and are updated according to the parity check constraints. These newer values become updated and the newer probabilities are send back to the symbol nodes which also performs the parity check constraint again. Then, at the bit-nodes, the values are again updated and if EQ. 4 is satisfied, the process is stopped and the correct codewords have been determined. The source message can then be extracted from the codeword.

FIG. 3A and FIG. 3B illustrate a generator realization and parity-check realization for the (8, 4, 4) code. FIG. 3A illustrates the $b_1$ to $b_7$ bit values 2-2 broadcast their value to the parity-check 2-3 so that these blocks can compute the sum-product constraint. Once the sum-product constraint has been computed, the network then causes the newly calculated $c_1$ to $c_4$ parity bit values 2-5 to send their value to the (n) symbols 2-4. The majority rule calculates the bit values in a second cycle. The flip from a generator realization to a parity-check realization is understood by comparing FIG. 3A and FIG. 3B. Now the (n) symbols are broadcast back to the (n-k) constraints once the (n-k) constraints have calculated their value, the network flips back to a generator realization and continually does an iterative loop until the number of loops is exceeded beyond a set value or the values of the (n) symbols $x_0$ through $x_7$ have arrived at their final value.

FIG. 4A illustrates the (n) symbols being in the broadcast mode are coupled to an interleaver block also known as a π network. The interleaver block then couples to the (n-k) constraints being in the zero-sum mode. The number of ports arriving from the (n) symbols to the interleaver is $P_L$ while the number of ports between the interleaver and the (n-k) constraints is $P_R$. The interleaver requires that $P_L$ equals $P_R$ to operate properly.

FIG. 4B illustrates a trellis block diagram for another decoding system called the Belief Propagation decoder and algorithm. This figure illustrates the flow of messages and computations using a sum-product algorithm to calculate the values. The values $x_0$ to $x_n$ generate the input messages $i_0$-$i_n$ which are the intrinsic a posteriori probabilities (APP) vectors derived from the observation. The output messages $e_o$-$e_n$ are the extrinsic APP vectors and are provided at $x_0$ to $x_n$. The blocks $C_o$-$C_n$ 4-2 capture the intrinsic data and proceeds to independently calculate the forward ($\alpha_1$ to $\alpha_n$) and backwards ($\beta_n$ to $\beta_1$) directions simultaneously. In the forward direction, the messages flows from $C_0$ to $C_n$ while in the backwards direction the messages flows from $C_n$ to $C_0$. Once the forward message reaches $C_n$ and the backward message reaches $C_0$, the BCJR algorithm is complete and the extrinsic data is output to $x_0$-$x_n$. This algorithm uses a sum-product rule within each of the blocks $C_o$-$C_n$ 4-2.

BRIEF SUMMARY OF THE INVENTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a thorough understanding of various embodiments of the present invention. However, in certain instances, well-known or conventional details are not described in order to provide a concise discussion of embodiments of the present inventions.

Another inventive embodiment of one of the inventions is to provide an LDPC decoder that can sustain performance levels for a 60 GHz system and dissipates low power in an integrated circuit, for example, in a chip fabricated using the CMOS technology. The embodiment of non-block check-node-update (CNU) scheduling uses a plurality of processors configured in a pipeline. The pipeline calculates the LLR and corrects corrupted symbols of a 60 GHz communication system. The pipeline uses the results that the pipeline had calculated two or more layers earlier. This inventive feature allows the LLR system to perform more iterations in a given time period thereby improving the BER of the LLR system.

Another embodiment of one of the present inventions is an apparatus for communication systems comprising: a first processor of a plurality of processors; a last processor of the plurality of processors; remaining processors of the plurality of processors coupled in series between the first processor and the last processor; an output of the last processor coupled to an input of a de-multiplexor; a plurality of memories each coupled to a corresponding output of the de-multiplexor; each input of a first multiplexor coupled to an output of a corresponding memory of the plurality of memories; and an output of the first multiplexor coupled to a first input of the first processor, further comprising: a plurality of registers each storing a different portion of a plurality of data symbols; each input of a second multiplexor coupled to an output of each corresponding the plurality of registers; and an output of the second multiplexor coupled to a second input of the first processor, wherein the plurality of registers configured to behave as shift registers when storing incoming symbols, wherein an iteration requires a number of clock cycles equal to a product of a count of the plurality of processors and a count of the plurality of registers, wherein a fraction of the data symbols are randomly corrupted symbols, wherein a log-likelihood ratio (LLR) is generated at the output of the last processor, wherein the LLRs correct the randomly corrupted symbols. The apparatus wherein one of the plurality of memories is configured to be enabled or wherein each of the plurality of processors perform a different function.

Another embodiment of one of the present inventions is a method of improving characteristics of a communication system comprising the steps of: coupling a plurality of processors in a pipeline structure; coupling an output of a last processor in the pipeline structure to an input of a memory; coupling an output of the memory to an input of a first processor in the pipeline structure; applying a stored result read from memory to a first processor in the pipeline; calculating a calculated result of the stored result at the output of the last processor; and storing the calculated result into the memory, wherein the stored result was calculated by the pipeline two or more calculated results earlier, further comprising the steps of: distributing equal portions of a plurality of data symbols among a corresponding plurality of registers; coupling each input of a multiplexor to an output of each one of the corresponding plurality of registers; and coupling an output of the multiplexor to a second input of the first processor in the pipeline structure, wherein an iteration requires a number of clock cycles equal to a product of a count of the plurality of processors and a count of the plurality of registers, wherein a fraction of the data symbols are randomly corrupted symbols, wherein a log-likelihood ratio (LLR) is generated at the output of the last processor, wherein the LLRs correct the randomly corrupted symbols. The method wherein one of the plurality of memories is configured to be enabled, wherein the plurality of registers configured to behave as shift registers when storing incoming symbols, wherein each of the plurality of processors perform a different function.

Another embodiment of one of the present inventions is an apparatus for communication systems comprising: a plurality of processors coupled in a pipeline structure; an output of a last processor in the pipeline structure coupled to an input of a de-multiplexor; a plurality of memories each coupled to a corresponding output of the de-multiplexor; each input of a first multiplexor coupled to an output of a corresponding memory of the plurality of memories; an output of the first multiplexor coupled to a first input of a first processor in the pipeline structure; a plurality of registers each storing a different portion of a plurality of data symbols; each input of a second multiplexor coupled to an output of each corresponding the plurality of registers; and an output of the second multiplexor coupled to a second input of the first processor, wherein each of the plurality of processors perform a different function, and a log-likelihood ratio (LLR) is generated at the output of the last processor.

The inventive embodiment of the LDPC supports 4 modes: Rate 1/2, Rate 5/8, Rate 3/4, Rate 13/16. The architecture is able to switch to non-blocking CNU scheduling architecture which has better performance than the blocking CNU scheduling architecture. The architecture uses an Offset Min-Sum with Beta equals 1 with a clock domain operating at 440 MHz. Four core processor are used in the architecture where the constraint matrix uses an sub-array of 42 (check nodes)×42 (variable nodes) in the macro-array of 168×672 bits. The constraint macro-matrix is a spare matrix where each "1" corresponds to a sub-array of a cyclically shifted identity matrix which is a shifted version of an identity matrix. Pipeline processing is used where the delay for each layer is 4 clock cycles. A 5-bit input channel LLR is used where symmetrical saturation is used for all input, internal nodes and output. To minimize storage, only the min1, min2, min1_index, prod_sign and sign are stored for each layer. For Rate 1/2, there are 8 layers which are compressed into 4 effective layers. For Rate 5/8, there are 6 layers which are compressed into 4 effective layers. The total gate count is 270 k gates.

BRIEF DESCRIPTION OF THE DRAWINGS

Please note that the drawings shown in this specification may not necessarily be drawn to scale and the relative dimensions of various elements in the diagrams are depicted schematically. The inventions presented here may be embodied in many different forms and should not be construed as limited to the embodiments set forth herein. Rather, these embodiments are provided so that this disclosure will be through and complete, and will fully convey the scope of the invention to those skilled in the art. In other instances, well-known structures and functions have not been shown or described in detail to avoid unnecessarily obscuring the description of the embodiment of the invention. Like numbers refer to like elements in the diagrams.

FIG. 2A shows a Tanner parity-check realization of a (8, 4, 4) code.

FIG. 2B illustrates each bit node broadcasting the input value to the constraint node network.

FIG. 2C-E depicts a constraint node performing a sum-product and sending the result to a bit-node.

FIG. 3A shows a Tanner generator realization of a (8, 4, 4) code.

FIG. 3B depicts a Tanner parity-check realization of a (8, 4, 4) code.

FIG. 6A depicts a table describing rate 1/2 LDPC code H matrix.

FIG. 7A depicts a blocking check-node-update scheduling in accordance with an embodiment of one of the present inventions.

FIG. 7B depicts a non-blocking check-node-update scheduling in accordance with an embodiment of one of the present inventions.

FIG. 10A depicts a table describing a layered architecture with three cycle clock delay per layer in accordance with an embodiment of one of the present inventions.

FIG. 10B illustrates a table describing an architecture with a non-blocking CNU scheduling in accordance with an embodiment of one of the present inventions.

DETAILED DESCRIPTION OF THE INVENTION

Figure 1:
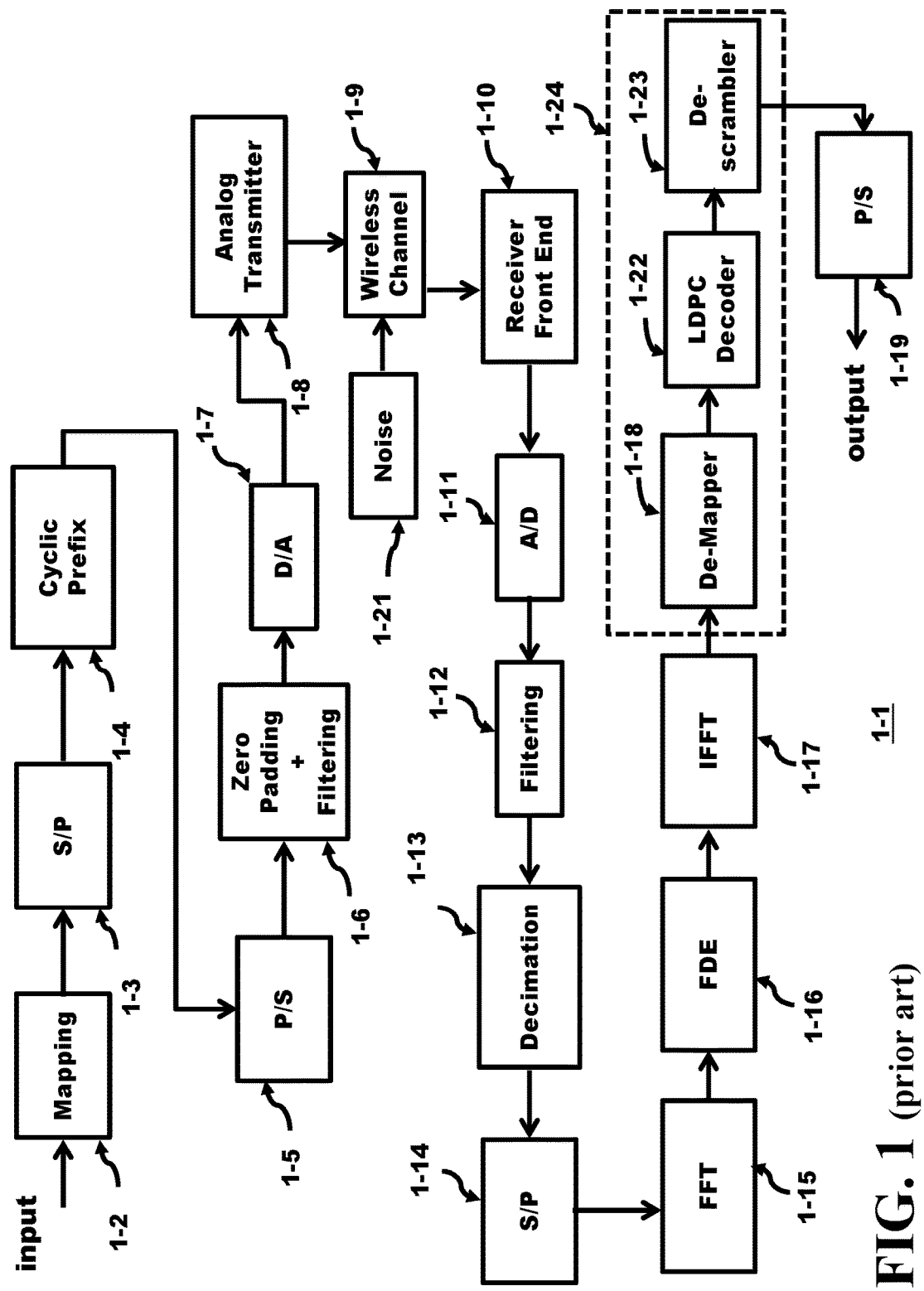
FIG. 1 depicts the transmitter and receiver blocks diagrams for a SC system.
Figure 2D:
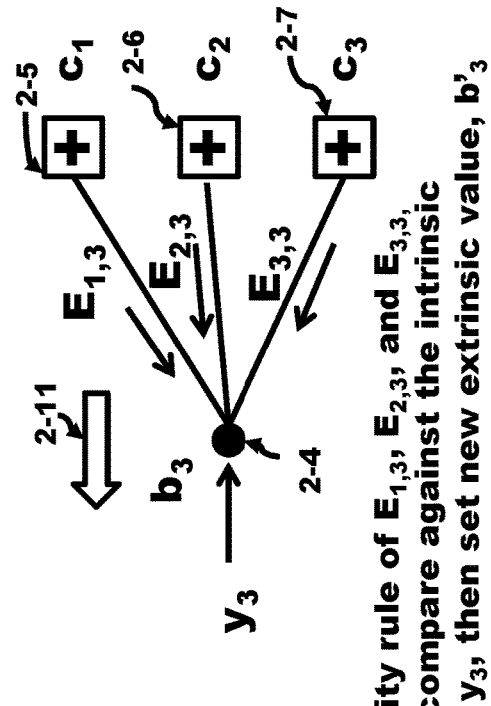
Figure 2E:
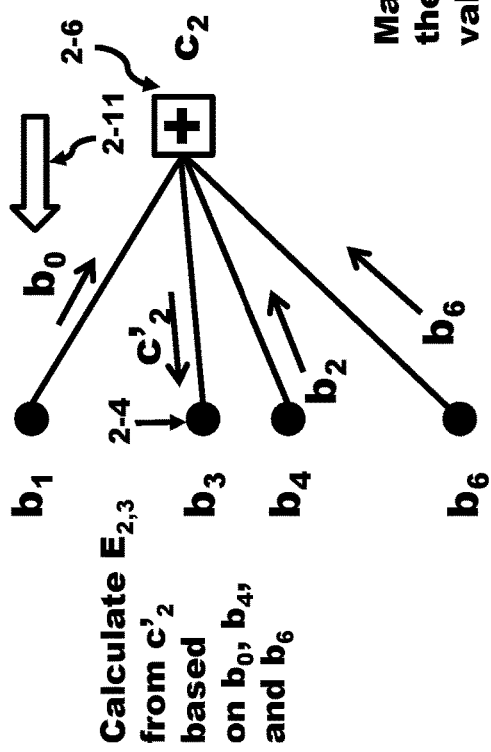
Figure 2F:
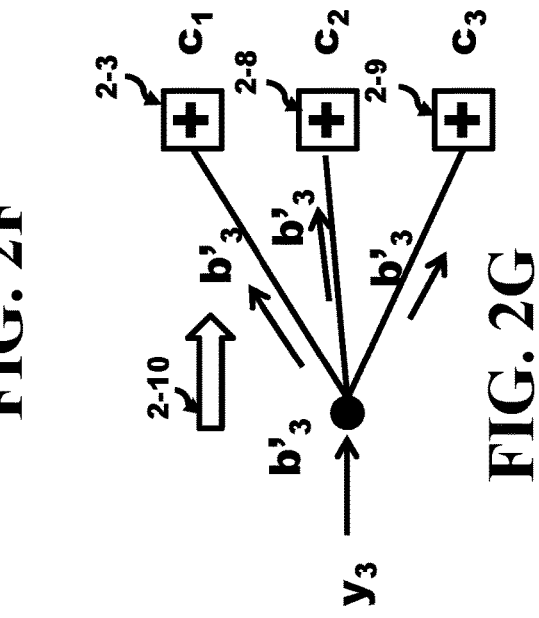
FIG. 2F shows a Tanner parity-check realization of a (8, 4, 4) code.
Figure 2G:
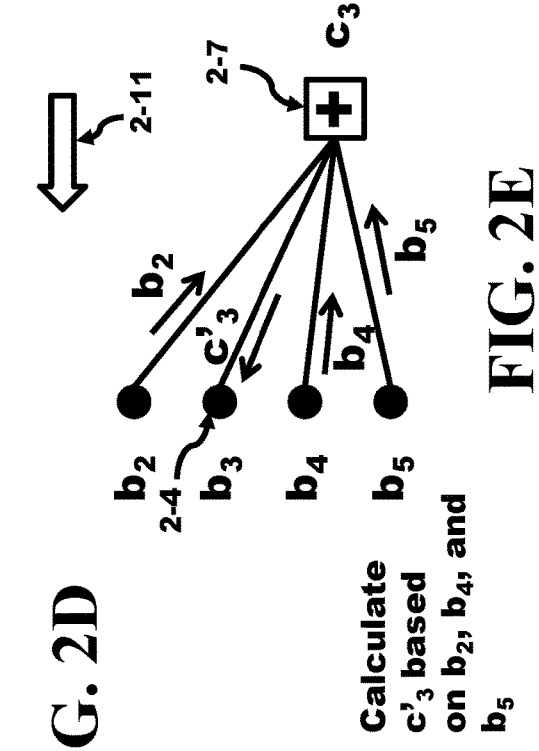
FIG. 2G illustrates each bit node broadcasting the input value to the constraint node network during the second cycle.
Figures 4A, 4B:
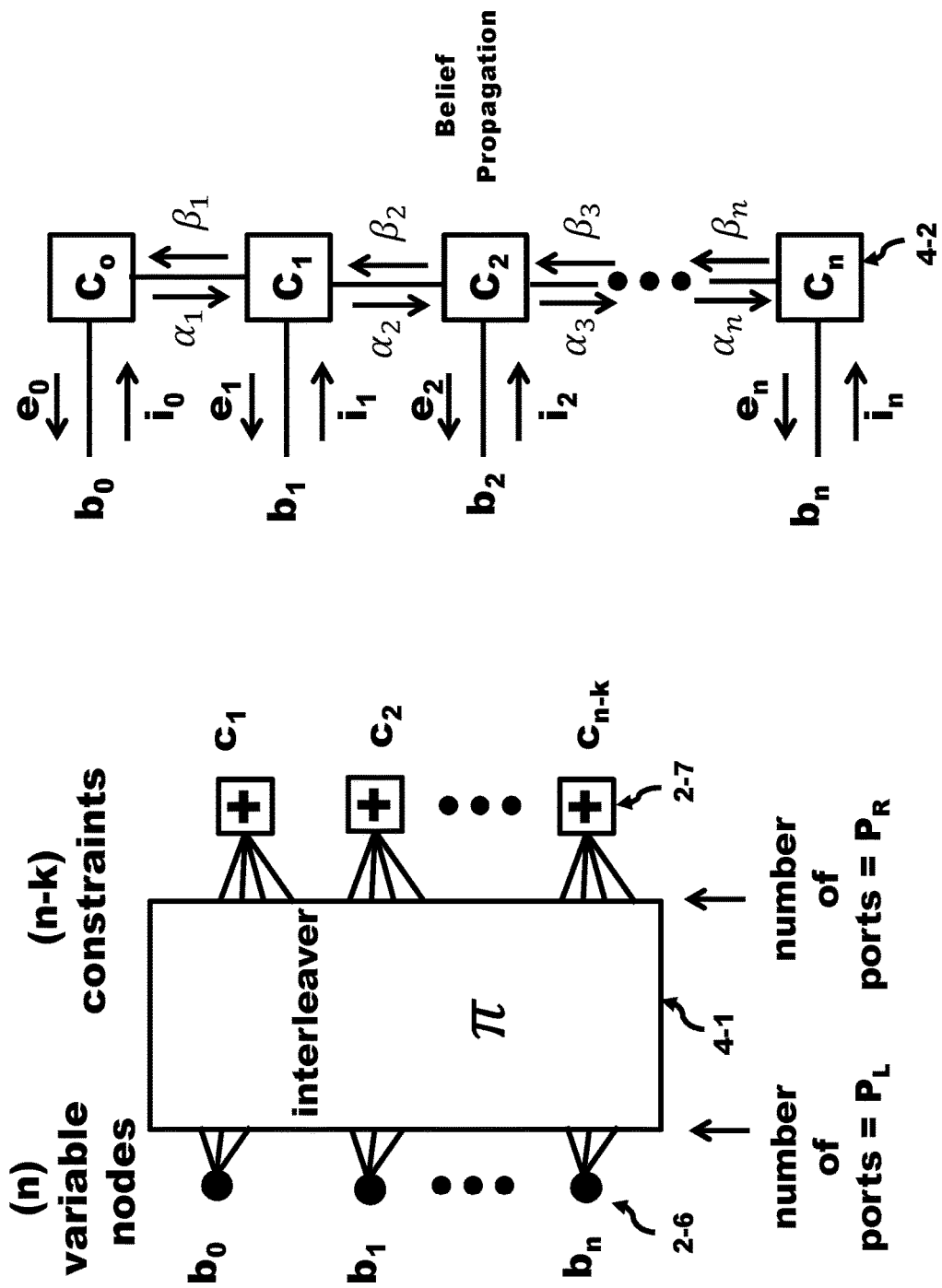
FIG. 4A illustrates a error correction system using an interleaver coupling the symbols to the constraints.
FIG. 4B presents a block diagram Belief Propagation network for error correction.
Figure 5:
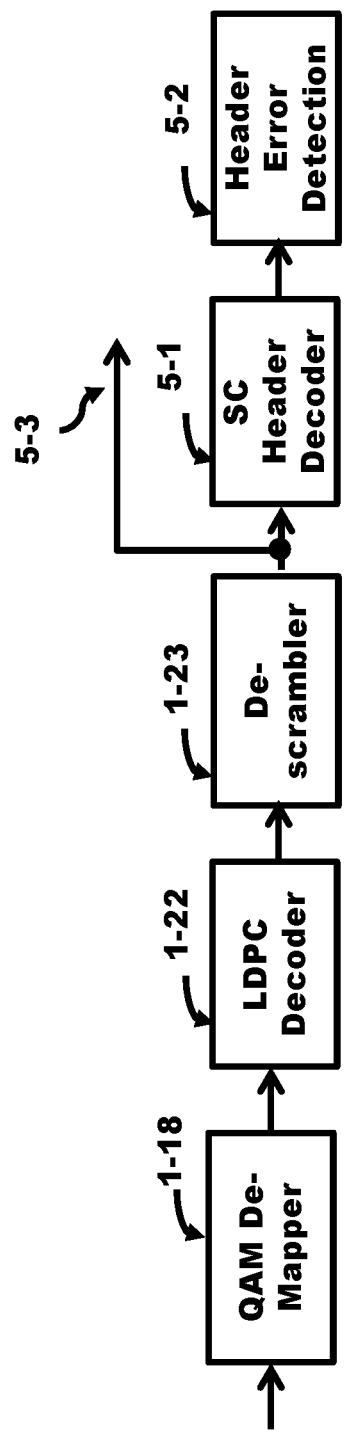
FIG. 5 shows a block diagram of the receiver path containing a LDPC decoder in accordance with an embodiment of one of the present inventions.

FIG. 5 depicts the decode path of the SC-LDPC path. The bit stream is de-Mapped by the QAM demapper 1-18 and translates the constellation points into binary values which are applied to the LDPC decoder 1-22. The recovered bit-nodes are applied to a de-scrambler 1-23 and forwarded to the baseband processor 5-3 and the SC header decoder 5-1 and the header error detector 5-2. Symbols transmitted at a source and received by a receiver at a destination usually arrive with errors (corrupted). The signal is randomly altered by the thermal noise and radiated electromagnetic noise from other sources picked up by the receiver. Redundancy is included in the symbols to allow the LDPC to correct any corrupted symbols.

The IEEE 802.11ad specification specifies four Low-Density Parity-Check (LDPC) codes, each of a different rate but with a common codeword size of 672 bits. Each of the parity-check matrices H, such as that described in EQ. 2, is partitioned into square submatrices of size Z×Z. where Z=64. FIG. 6A presents a rate 1/2 LDPC code matrix H 6-1. H has 336 rows X 672 columns. Other codes include: Rate-3/4 LDPC code matrix H=168 rows x 672 columns, Z=42; Rate-13/16 LDPC code matrix H=126 rows x 672 columns, Z=42; and Rate-5/8 LDPC code matrix H=252 rows x 672 columns, Z=42.

The submatrices are either cyclic-permutations of the identity matrix, or null submatrices with all zero entries. A location with integer i denotes the cyclic-permutation submatrix Pi obtained from the Z×Z identity matrix by cyclically shifting the columns to the right by i elements. The matrix $P_0$ is the Z×Z identity matrix. An empty location denotes a null submatrix of size Z×Z. Examples of $P_0$, $P_1$, and $P_3$ with Z=4 are provided in FIG. 6C. Matrix 6-4 is the unity matrix where i=0; matrix 6-5 where i=1 shifts the "1" bit right by one unit from the unity matrix. Matrix 6-6 where i=3 shifts the "1" bit right by three positions from the unity matrix.

Figures 6B, 6C:
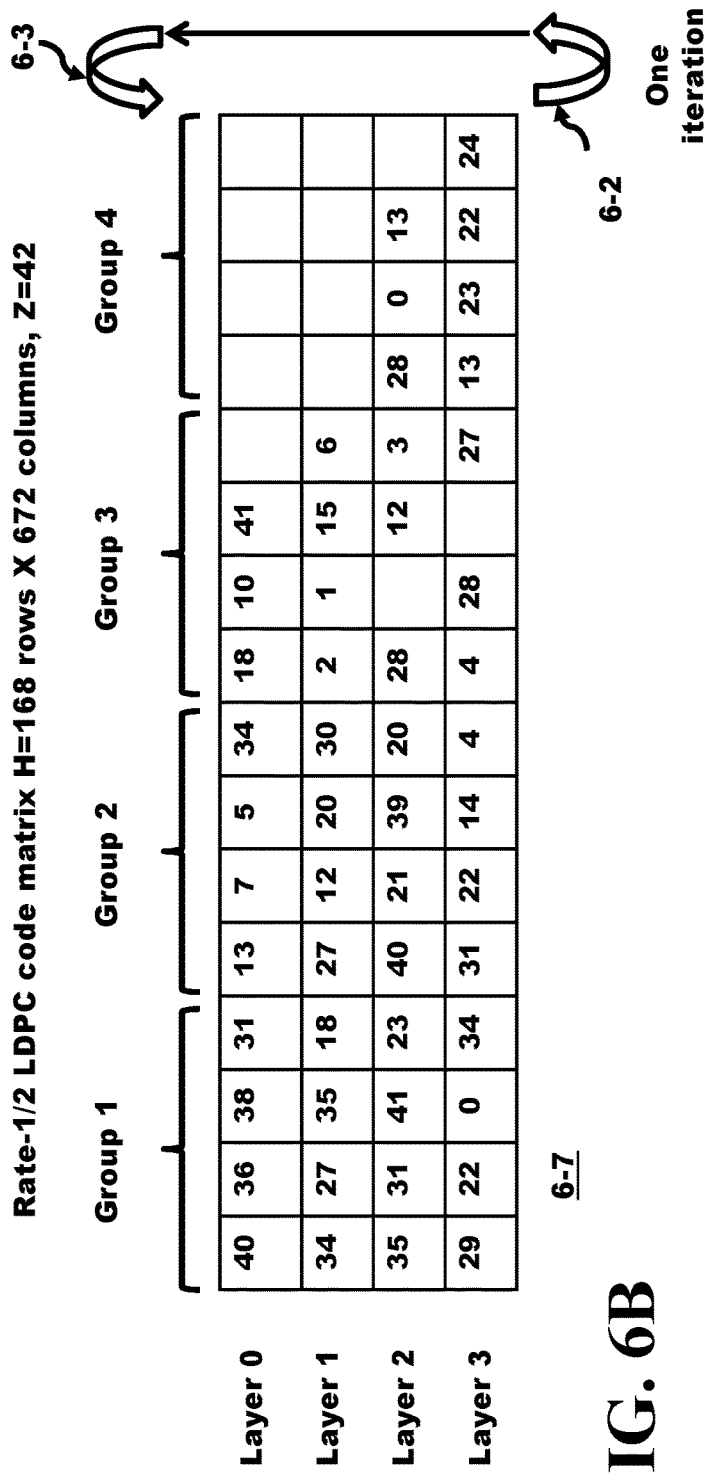
FIG. 6B illustrates a table describing a collapsed rate 1/2 LDPC code H matrix in accordance with an embodiment of one of the present inventions.
FIG. 6C presents several examples of cyclic-permutation submatrixes.

The matrix in FIG. 6A presents a rate 1/2 LDPC code matrix H 6-1. H has 336 rows×672 columns and can be reduced by combining layer 0 and layer 2, layer 1 and layer 3, layer 4 and layer 6, and layer 5 and layer 7 to arrive at the H matrix 6-7 presented in FIG. 6B. The previous 8 layers of the matrix 6-1 has been reduced to only four layers (0-3) in the matrix 6-7 shown in FIG. 6B.

Hardware to calculate the check node update for the determination of LLR is required to perform these operations for each of the four layers. Each layer must operate on 16 64×64 matrixes. A hardware unit comprising 16 separate units can be used, but the transistor gate count would be massive, the clocking network to synchronize the circuit would be power dissipative, and a large portion of the semiconductor chip area would be used. A hardware unit comprising single unit can be used, but then the calculations would need to be run repetitively 16 times. The area usage would be reduced but the time to perform all 16 repetitions would take too long. A compromise of using a hardware unit of 4 separate units was determined which allows moderate area usage, low power dissipation, and adequate performance. Thus, the 16 columns of matrices are partitioned into 4 groups: group 1; group 2; group 3; and group 4, as illustrated in the reduced H matrix 6-7 shown in FIG. 6B.

The check node update determines the LLR, see EQ. 34. Several steps are necessary to perform the calculation of the LLR on a layer by layer basis. The output results of the current layer are applied to the next sequential layer in series to improve the corrupted symbols that were transmitted in over noisy channel. The design uses four layers.

As illustrated in the matrix 6-7 in FIG. 6B, after 4 layers, (layers 0-3), the LDPC has performed one iteration 6-2 and will start the next iteration 6-3. If the result of EQ. 1 is satisfied then the iterative cycle can stop; otherwise, another iteration is performed. If the iteration had stopped then the calculations were performed on each of the four layers in the H matrix just once. The calculations are computational intensive and the 802.11ad specification has specified timing criteria to perform the LLR calculation. The iteration is partitioned into four groups and each group is partitioned into four equal time components of 2.27 nsec as clocked by flip-flops at each boundary.

A processor is used in each of these four equal time slots where the output of a first processor is serially coupled to the input of the second processor, the output of a second processor is serially coupled to the input of the third processor, and the output of a third processor is serially coupled to the input of the fourth processor forming a pipeline structure. Each of these processors has a critical path which is defined as the longest delay of that particular processor. All processors must meet the worst case delay of the longest logic gate sequence of the state machine in that particular processor, that is, for this system to communicate at 60 GHz using the IEEE 802.11ad protocol, the allowed worst case propagation time delay of each of the processors is 2.27 nsec. The pipeline is the hardware of the system which is partitioned into four processors each having a different function. The four processor functions of the state machine are: 1) a first processor to control where memory is read to extract a previous calculated results and the value of the received input; 2) a second processor to subtract, saturate 2's complement to magnitude, and subtract data terms (Offset Min-sum max(0, x-beta); 3) a third processor to calculate the min (find min1, min2, min1_index for each layer); and 4) a fourth processor to assemble the min together (collecting and converting magnitude to 2's compliment. For a communication system to be operable to 60 GHz, the clock rate needs to be 440 MHz.

There one pipeline to generate the LLR of all four groups. This pipeline must be shared with the three other groups in order to perform the calculation. And as mentioned earlier the pipeline is partitioned into four processor functions segregated by clocked flip-flops which form the pipeline. When group 1 of layer −1 is being manipulated by the first processor function, a clock cycle of 2.27 ns passes before the results are latched. At that point, the first processor function becomes free to operate on group 2. Meanwhile the result in the first flip-flop of group 1 is applied to the second of four processor functions to perform the next calculation then 2.27 ns later the results are latched in a second set of flip-flops. Simultaneously, group 2 is being manipulated by the first of four processor functions. A clock cycle of 2.27 ns passes before both of these results are latched. Then, the third group is manipulated by the first processor function, a clock cycle of 2.27 ns passes before the results are latched. Simultaneously, group 1 is in the third processor function, group 2 is in the second processor function. Then, the last (fourth) group is manipulated by the first processor function, a clock cycle of 2.27 ns passes before the results are latched. Simultaneously, group 1 is in the fourth processor function, group 2 is in the third processor function, and group 3 is in the second processor function. This allows maximum sharing of the hardware/software to perform the calculation of the LLR. Note the wait period delay 7-5 of three clock cycles in FIG. 7A. This is required to allow the fourth group to complete the last of four calculations.

FIG. 7A illustrates how the log likelihood ratios from a first layer are propagated to the next layer. This is called the blocking check-node-update (CNU) scheduling. The LLR from layer −1 is applied to layer 0 as indicated by 7-3. Then the pipeline sequence provided in the previous paragraph now occurs within layer 0. Each layer takes 7 clock cycles. An iteration comprises the completion of four layers before the next iteration can start. From FIG. 7A, the iteration requires 28 clock ticks before the next iteration can occur.

An innovative and inventive embodiment is illustrated in FIG. 7B. This is called the non-blocking CNU scheduling. The calculation of the LLR is found to be additive in nature. Thus, it is not required to wait until the previous group LLR results are calculated. Instead, the results 7-4 from layer −1 which is two layers earlier can be used in layer 1 to overcome the wait period delay 7-5 as illustrated in FIG. 7A. This allows group 1 of layer 1 to use the first of four processor functions as soon as group 4 of layer 0 is finished using the first of four processor functions. This innovative feature completes the iteration in 16 clock ticks and allows the next iteration to occur immediately.

Figure 8A:
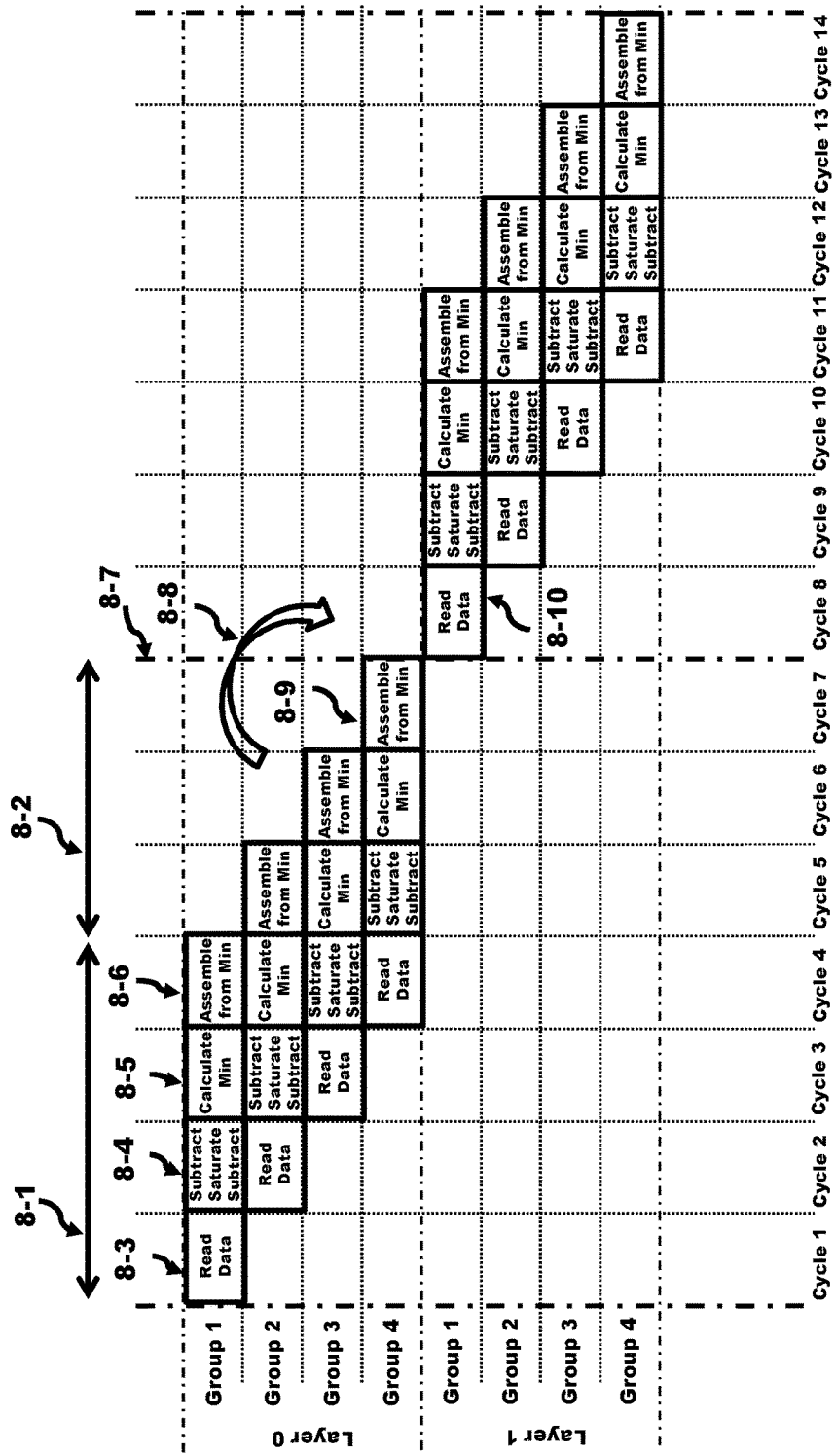
FIG. 8A illustrates a more detailed blocking check-node-update scheduling shown over several clock cycles in accordance with an embodiment of one of the present inventions.

FIG. 8A illustrates the Blocking CNU in detail. In in group 1 of layer 0 the first of four processor functions 8-3 is the read data from memory which occurs going clock cycle 1. Then, at the start of clock cycle 2, group 2 reads the memory and the second of four processor functions 8-4 performs the subtract-saturate-subtract function for group 1. During clock cycle 3, group 3 reads the data, while group 2 uses the subtract-saturate-subtract function and group 1 utilizes the third of the four processor functions to calculate men 8-5. During clock cycle 4, group 4 reads the data, group 3 uses the subtract-saturate-subtract function, group 2 utilizes the second of the four processor functions to the calculate men and group 1 assembles the values from min. Then, in clock cycle 5, group 1 is placed in a wait state which the remaining three groups perform the functions of the last three processor functions. This sequence continues until group 4 is assembling from men 8-9 while simultaneously groups 1-3 are in a wait state. Once group 4 has completed assembling from men 8-9, the calculation for layer 0 is complete 8-7. Now the results 8-8 from layer 0 can be applied to the four groups in layer 1 where the first of four processor functions, the read data 8-10, operates on group 1 of layer 1. Note that all four processor functions (8-3, 8-4, 8-5, and 8-6) for group 1 in layer 0 takes four clock cycles 8-1. However an additional three cycles 8-2 is required for group 0 to complete the last three processor functions. Layer 0 is completed between clock cycle 7 and clock cycle 8 8-7. In clock cycle 8, the process of calculating the LLR for layer 1 commences where the results 8-8 from the previous layer (layer 0) are used in layer 1.

Figure 8B:
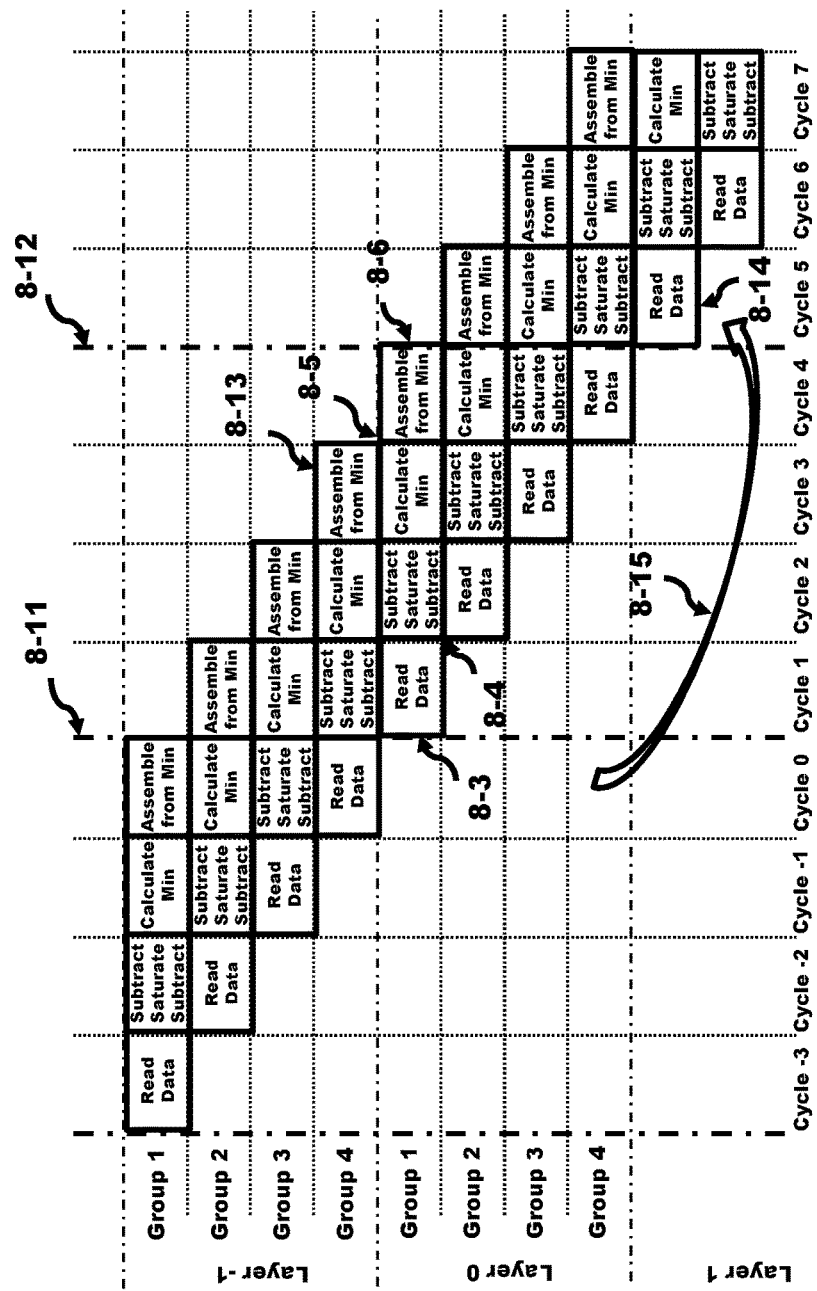
FIG. 8B depicts a more detailed non-blocking check-node-update scheduling shown over several clock cycles in accordance with an embodiment of one of the present inventions.

FIG. 8B illustrates the Non-blocking CNU in detail. At the start 8-11 of layer 0, group 1 of layer 0 performs the first of four processor functions 8-3 which is the read data from memory that occurs during clock cycle 1. Then, at the start of clock cycle 2, group 2 reads the memory and the second of four processor functions 8-4 performs the subtract-saturate-subtract function for group 1. During clock cycle 3, group 3 reads the data, while group 2 uses the subtract-saturate-subtract function and group 1 utilizes the third of the four processor functions to calculate men 8-5. During clock cycle 4, group 4 reads the data, group 3 uses the subtract-saturate-subtract function, group 2 utilizes the second of the four processor functions to the calculate men and group 1 assembles the values from min. Then, in clock cycle 5, the LLR results 8-15 of layer −1 are applied, allowing the pipeline to continue the previous sequence. Wait states are not required in the Non-blocking CNU. The start of layer 0 aligns with the line 8-11 while layer 0 terminates at line 8-12. All four processor functions of the pipeline are being used all the time.

The Non-blocking CNU only requires 16 clock cycles to perform one iteration while the Blocking CNU requires 28 clock cycles to perform an iteration. If the time allotted to perform the LLR is fixed, the Non-blocking CNU can do more iterations than the Blocking CNU. Thus, this inventive embodiment of Non-blocking CNU can deliver a signal with fewer errors and is a more efficient system.

Figure 9:
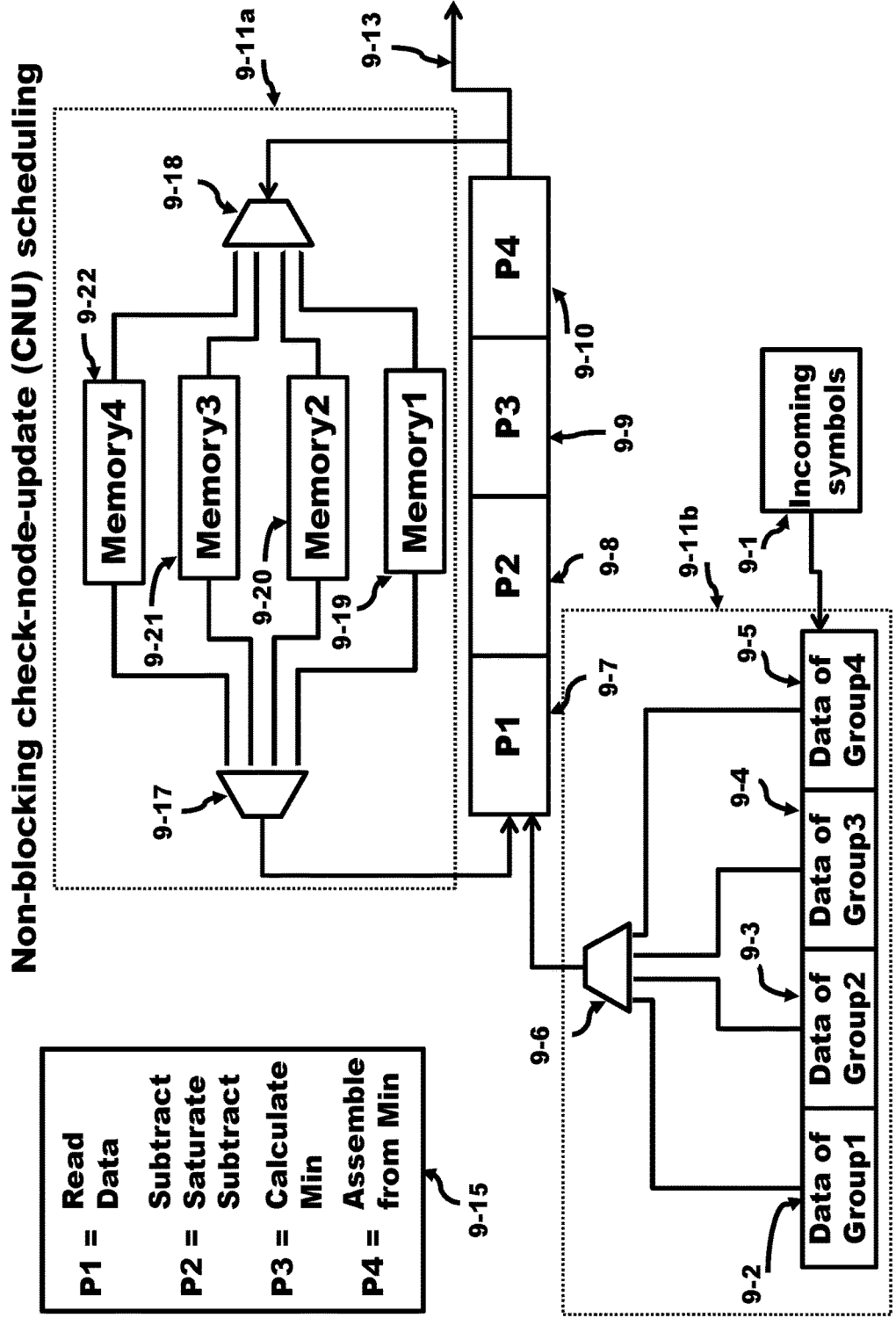
FIG. 9 presents a non-blocking check-node-update scheduling block diagram in accordance with an embodiment of one of the present inventions.

A block diagram of a Non-blocking check note update scheduling architecture is illustrated in FIG. 9. Incoming intrinsic symbols 9-1 are fed into memory consisting of groups 1 through 4 (9-2, 9-3, 9-4, and 9-5). This memory can also be formed registers or shift-registers. Once this memory is filled with the intrinsic symbols, the intrinsic symbols can be repetitively applied through the 4 to 1 multiplexor 9-6 to perform additional iterations. The multiplexor transfers one of the four inputs to the output of the multiplexor based on a control applied to the multiplexor. For instance, with proper control, the multiplexor can provide the data of group 1 at the output of the multiplexor for a first clock cycle, the data of group 2 at the output of the multiplexor for the next clock cycle, the data of group 3 at the output of the multiplexor for the next clock cycle, the data of group 4 at the output of the multiplexor for the next clock cycle, and the data of group 1 at the output of the multiplexor for the next clock cycle, constantly cycling in a loop. An iteration is performed when the data cycles through the data group 1-4 once.

The pipeline consists of the following processors that are series coupled: P1 9-7; P2 9-8; P3 9-9; and P4 9-10. The functions that these processors P1-4 perform are identified in the insert 9-15. The output of this pipeline is available at 9-13 and is also applied to the 1-4 de-multiplexor. For instance, with proper control, the de-multiplexor can provide the output of the pipeline to the input of Memory1 for a first clock cycle, the de-multiplexor can write the output of the pipeline to the input of Memory2 for a second clock cycle, the de-multiplexor can write the output of the pipeline to the input of Memory3 for a next clock cycle, the de-multiplexor can write the output of the pipeline to the input of Memory4 for a next clock cycle, the de-multiplexor can write the output of the pipeline to the input of Memory1 for a next clock cycle, constantly cycling in a loop. An iteration is performed when the all four memories are written once. In summary, the de-multiplexor applies the output result of P4 9-10 to one of four memories where memory1 9-19 stores the results of group 1 calculations, memory2 9-20 stores the results of group 2 calculations, memory3 9-21 stores the results of group 3 calculations, and memory4 9-22 stores the results of group 4 calculations. The functions of the processors P1, P2, P3, and P4 in the pipeline are identified in inset 9-15.

The 4-1 multiplexor 9-17 applies one of the earlier stored results of all group 1 calculations stored in memory1 9-19 to P1 9-7, one of the earlier stored results of all group 2 calculations stored in memory2 9-20 to P1 9-7, one of the earlier stored results of all group 3 calculations stored in memory3 9-21 to P1 9-7, and one of the earlier stored results of all group 4 calculations stored in memory4 9-24 to P1 9-7, in sequential order. The earlier stored results read from memory can be the calculations performed in the pipeline from two or more earlier layers.

The selector function of the two multiplexors 9-6, 9-17 and the de-multiplexor 9-18 have characteristics of a memory interaction. For instance, to write a data bit into a content of a particular memory cell in a memory array, a de-multiplexor operation occurs to present the data bit to that particular memory cell. Furthermore, to read the contents of a particular memory cell in a memory array, a multiplexor operation occurs to present the data bit which was in that particular memory cell at the output of the memory. The read and write logical structures of a memory are similar to the multiplexor and de-multiplexor operations.

Thus, all of the components of the multiplexor 9-17 and 9-6, de-multiplexor 9-18, memories 9-19 through 9-22, and the memories of the data of group 1-4 located dotted boxes 9-11a and 9-11b can be included inside one memory. This transfers the hardware of the system in FIG. 9 into a simpler physical model at the expense of increasing the software complexity of the system.

FIG. 10A illustrates a table describing a layered Blocking CNU decoder having three wait states per layer. The BPSK constellations require 192 cycles to perform the LLR while QPSK only requires 96 cycles. The architecture is clock at a cycle rate of 440 MHz, uses an offset Min-Sum algorithm, and uses four core pipeline processors where each "number" in the macro-matrix of FIG. 6B corresponds to a 42×42 cyclically shifted identity matrix which is a shifted version of an identity matrix. The architecture operates at a coding rate of 1/2, 5/8, 3/4, and 13/16 and requires 27, 26, 28 and 21 cycle cycles to perform the decoding. The maximum number of iterations to decode a BPSK constellation is 7, 7, 6, and 9 and a QPSK constellation is 3, 3, 3, and 4 when the architecture operates at a coding rate of 1/2, 5/8, 3/4, and 13/16.

FIG. 10B illustrates a table describing a layered Non-blocking decoder having wait-less states of operation. The architecture is clock at a cycle rate of 440 MHz, uses an offset Min-Sum algorithm, and uses four core pipeline processors where each "number" in the macro-matrix of FIG. 6B corresponds to a 42×42 cyclically shifted identity matrix which is a shifted version of an identity matrix. The architecture operates at a coding rate of 1/2, 5/8, 3/4, and 13/16 and requires 16, 16, 16 and 12 cycle cycles to perform the decoding. The maximum number of iterations to decode a BPSK constellation is 11, 11, 11, and 15 and a QPSK constellation is 5, 5, 5, and 7 when the architecture operates at a coding rate of 1/2, 5/8, 3/4, and 13/16.

Finally, it is understood that the above descriptions are only illustrative of the principle of the current invention. Various alterations, improvements, and modifications will occur and are intended to be suggested hereby, and are within the spirit and scope of the invention. This invention may, however, be embodied in many different forms and should not be construed as limited to the embodiments set forth herein. Rather, these embodiments are provided so that the disclosure will be thorough and complete, and will fully convey the scope of the invention to those skilled in the arts. It is understood that the various embodiments of the invention, although different, are not mutually exclusive. In accordance with these principles, those skilled in the art may devise numerous modifications without departing from the spirit and scope of the invention. In addition, this inventive embodiment has the potential to improve overall performance when calculating additive functions where the particular order of calculation does not affect the final result, for example, adders, multipliers, etc.

What is claimed is:

1. An apparatus, comprising:
   a plurality of processors arranged in a pipeline structure and configured to operate on a plurality of layers of data, each layer comprising a plurality of groups of data symbols received from a noisy transmission medium; and
   a memory comprising an input coupled to an output of a last processor in the pipeline structure, and an output coupled to an input of a first processor in the pipeline structure, the memory comprising read and write logical structures configured to perform multiplexor and de-multiplexor operations, comprising:
   for each group in each layer, applying a stored data set read from the memory to the first processor in the pipeline structure;
   producing a calculation of a log-likelihood ratio (LLR) of the data symbols at the output of the last processor; and
   storing the LLR in the memory; and
   operating at least one processor in the pipeline structure to process a next layer before a current layer is completed, wherein a stored data set in the next layer comprises a portion of the LLR calculation produced from a layer previous to the current layer thereby providing for non-blocking check-node-update scheduling.

2. The apparatus of claim 1, further comprising:
   a plurality of registers, each storing a different portion of a plurality of data symbols; and
   a multiplexor, wherein each input of the multiplexor is coupled to an output of each of the plurality of registers, and an output of the multiplexor is coupled to a second input of the first processor.

3. The apparatus of claim 2, wherein the plurality of registers is configured to behave as shift registers when storing incoming symbols.

4. The apparatus of claim 2, wherein an iteration requires a number of clock cycles equal to a product of a count of the plurality of processors and a count of the plurality of registers.

5. The apparatus of claim 1, wherein the LLR is used to correct corrupted symbols in the data.

6. The apparatus of claim 1, wherein each of the plurality of processors perform a different function.

7. The apparatus of claim 1, wherein the first processor is configured to read data from a memory, a second processor is configured to perform a subtract-saturate- subtract function, a third processor is configured to calculate a min, and the last processor is configured to assemble values from the min.

8. A method, comprising:
   arranging data symbols received from a noisy transmission medium into a layer comprising a plurality N of groups of data symbols equal to N processors in a pipeline;
   for each of N clock cycles, inputting a sequential one of the N groups of data symbols into a first processor in the pipelines, and for each group of data symbols being processed in the pipeline, inputting a corresponding processor's output data symbols to a next processor in the pipeline; and
   for an N+1 clock cycle, outputting a log-likelihood ratio (LLR) calculation of a first group of data symbols from a last processor in the pipeline, outputting data from each of the N processors other than the last processor to the next processor in the pipeline, and inputting an LLR calculation from a previously processed layer to the first processor, thereby providing for non-blocking check-node-update scheduling.

9. The method of claim 8, further comprising:
   distributing groups of data among a corresponding plurality of registers;
   coupling each input of a multiplexor to an output of each one of the corresponding plurality of registers; and
   coupling an output of the multiplexor to a second input of the first processor.

10. The method of claim 9, wherein an iteration comprises a number of clock cycles equal to a product of a count of the plurality of processors and a count of the plurality of registers.

11. The method of claim 8, wherein each of the N processors is configured to perform a different function.

12. The method of claim 8, wherein the first processor is configured to read data from a memory, a second processor is configured to perform a subtract-saturate-subtract function, a third processor is configured to calculate a min, and the last processor is configured to assemble values from the min.

13. The method of claim 8, wherein the LLR corrects corrupted symbols in the data.

14. At least one non-transitory computer-readable memory coupled to a pipeline comprising a plurality of processors, the at least one memory including instructions stored therein and executable by at least one of the plurality of processors to:
   for each of a plurality of groups of data in each of a plurality of layers, each of the plurality of groups comprising data symbols received from a noisy transmission medium, apply stored data read from the at least one memory to a first processor in the pipeline;
   produce a calculation of a log-likelihood ratio (LLR) of data symbols at the output of a last processor in the pipeline;
   store the LLR in the at least one memory; and
   operate at least one processor in the pipeline to process a next layer before a current layer is completed, wherein a stored data set used by the next layer comprises a portion of the LLR calculation produced from a layer previous to the current layer, thereby providing for non-blocking check-node-update scheduling.

15. The at least one memory of claim 14, comprising a plurality of registers, each storing a different portion of a plurality of data symbols, the at least one memory further comprising instructions to:
   distribute the plurality of groups of data among the plurality of registers;
   couple each input of a multiplexor to an output of each one of the plurality of registers; and
   couple an output of the multiplexor to a second input of the first processor.

16. The at least one memory of claim 15, wherein an iteration comprises a number of clock cycles equal to a product of a count of the plurality of processors and a count of the plurality of registers.

17. The at least one memory of claim 14, wherein the first processor is configured to read data from the at least one memory, a second processor in the pipeline is configured to perform a subtract-saturate-subtract function, a third processor in the pipeline is configured to calculate a min, and the last processor is configured to assemble values from the min.

18. The at least one memory of claim 14, wherein the LLR is used to correct corrupted symbols in the data.

19. The at least one memory of claim 14, wherein each processor in the pipeline is configured to perform a different function.

* * * * *